United States Patent
Terada

(10) Patent No.: US 6,420,889 B1
(45) Date of Patent: Jul. 16, 2002

(54) MULTI PROBE UNIT AND MEASURING APPARATUS COMPRISING THEREOF

(75) Inventor: Shigeki Terada, Higashi-Chichibu-Mura (JP)

(73) Assignee: Kabushiki Kaisha Toshiba, Kanagawa-Ken (JP)

( * ) Notice: Subject to any disclaimer, the term of this patent is extended or adjusted under 35 U.S.C. 154(b) by 19 days.

(21) Appl. No.: 09/527,846

(22) Filed: Jul. 24, 2000

(30) Foreign Application Priority Data

Mar. 18, 1999 (JP) ............................................. 11-073905

(51) Int. Cl.⁷ ................................................. G01R 31/02
(52) U.S. Cl. ..................................................... 324/755
(58) Field of Search ................................. 324/754, 537, 324/755, 765; 439/482, 65, 68, 700

(56) References Cited

U.S. PATENT DOCUMENTS 4,731,577 A * 3/1988 Logan .................... 324/158 F
5,557,212 A * 9/1996 Isaac et al. ................. 324/755
5,969,533 A * 10/1999 Takagi ......................... 324/754

* cited by examiner

Primary Examiner—Safet Metjahic
Assistant Examiner—E P LeRoux
(74) Attorney, Agent, or Firm—Pillsbury Winthrop LLP

(57) ABSTRACT

For the purpose of reducing noise entering from outside and cross talk to a practically negligible extent even when using covered conducting wire made of only conducting wires and insulators, a multi-probe unit has a plurality of probes for contact with a plurality of conductor patterns to be inspected which are aligned side by side, in which every two adjacent ones of the probes for contact with odd-numbered one and even-numbered one of the conductor patterns are positioned in upper and lower levels distant in the thickness direction, and a shield plate of a conductive material having an electrically shielding function is interposed between the upper and lower probes.

9 Claims, 3 Drawing Sheets

MULTI PROBE UNIT AND MEASURING APPARATUS COMPRISING THEREOF

BACKGROUND OF THE INVENTION

This invention relates to a multi-probe unit and a measuring apparatus using same in which extreme ends of probes formed at end portions of conducting wires are in contact with a number of densely arranged conductor patterns, and opposite ends or the conducting wires are electrically connected to a measuring apparatus.

For the purpose of electrically inspecting substrates having arrays of semiconductor elements and TFT (thin film transistor) liquid crystal display elements, widely used is a method of using a number of metal fine needles and bringing them into contact with electrodes formed on elements thereby to make electrical contact of these elements, external power source and measuring apparatus.

Along with the recent tendency and development toward higher speeds and higher performances of semiconductor elements and liquid crystal display elements, it has become a common knowledge to shield needles for preventing mixture of electric noise generated around probes and crosstalk between probes.

FIG. 2A is a perspective view showing configuration of a shielded conductor line 1 forming a probe, and FIG. 2B is a perspective view showing general configuration of a multi-probe unit 10 in which a number of shielded conducting wires are fixed. In FIG. 2A, the shielded conductor line 1 is composed of a central conductor 2, insulator 3 and metal tube 4. Among these components, the central conductor 2 is typically made of tungsten or other hard metal. Its first end 2a extends beyond the insulator 3 and the metal tube 4 by a predetermined length, and its extreme end is bent like a hook and sharpened to form a probe needle 5. The opposite second end of the central conductor 2 extends beyond the insulator 3 and the metal tube 4 by an enough length for electrical connection. The insulator 3 is a tube member of an insulating material such as polyethylene, which wraps the central conductor 2. The metal tube 4 as a shielding member covers it from outside, and this metal tube 4 is connected to a ground potential to prevent mixture of electrical noise and generation or cross talk between probes.

The multi-probe unit 10 shown in FIG. 2B is made by fixing such shielded conducting wires 1 on the bottom surface of a printed circuit board (PCB) 11. In this case, although only apart thereof is illustrated for simplicity, the shielded conducting wires 1 are fixed on the printed circuit board 11 by a conductor fixing member 12 made by injection molding, for example, such that their probe needles 5 be aligned with substantially equal distances at the location for connection with electrodes 21 on a liquid crystal display substrate 20, and they radially spread out from their first ends with the probes 5 toward their opposite second ends. In this case, the conductor fixing member 12 is located at a front end of the printed circuit board 11, and on a rear end portion of the printed circuit board 11, connector jacks 13 as many as the shielded conductors 1 are fixed, with their terminals connected to the second ends 2b of the central conductors 2.

Each central conductor 2 forming the shielded conductor 1 has the diameter of about 0.2 mm, and the diameter of the shielded conductor line 1 exceeds approximately 0.5 mm. On recent substrates having arrays of TFT liquid crystal display elements, the pitch of electrodes is getting narrower, and in some cases, their interval is as small as 50 μm approximately. To bring tips of probe needles 5 into contact with such densely arranged electrodes, even when the shielded conducting wires 1 were densely arranged to radially extend and also overlap in vertically different stages, the minimum pitch of electrodes enabling contact with tips of probe needles was only 200 μm approximately.

Further, even in the case of electrodes aligned at intervals of approximately 200 μm, when the number of electrodes is 20 or more, a multi-probe unit 10 was made by using covered conducting wires without the metal tubes 4, that is, covered conducting wires made of only central conductors 2 and insulators 3, at the cost of the countermeasure against noise and cross talk. Therefore, even with electrodes aligned at intervals of 50 μm, it was compelled to use covered conducting wires made of only central conductors 2 and insulators 3.

Recently, there have been developed liquid crystal display devices in which scanning line driving circuits and video signal line driving circuits for driving liquid crystal display elements using TFT of polysilicon as their components are incorporated together with the liquid crystal display devices on common substrates, LSIs using TAB (tape automatic bonding) technique to apply scanning pulses to scanning lines and video signals to video signal lines, and so on. When these devices were electrically inspected with multi-probe units using covered conducting wires, explained above, the tests were liable to be adversely affected by noise and cross talk, and this inspection technique involved the problem to be overcome, namely, unavailability beyond limited items of inspection and insufficient inspection performance.

SUMMARY OF THE INVENTION

It is therefore an object of the invention to provide a multi-probe unit and a measuring apparatus using same, which can reduce mixture of noise from outside and cross talk to a practically negligible level and thereby improve the electrical inspection performance even when using covered conducting wires made of only conducting wires and insulators.

According to the invention, there is provided a multi-probe unit having conducting wires which have first end portions forming probes whose extreme ends contact with a number of densely arranged conductor patterns and second ends electrically connected to a measuring apparatus, comprising: a substrate which can be held from outside; a number of covered conducting wires each made of a central conductor whose intermediate portion except opposite end portions thereof is covered by an insulating cover, each central conductor having a first end portion which is bent to form the probe; a conductor fixing member for holding extreme ends of the probes of the covered conducting wires in alignment at substantially the same intervals as those of the conductor patterns, then radially spreading intermediate portions of the covered conducting wires relative to the first end portions thereof, and fixing the intermediate portions of the covered conducting wires such that the intermediate portions be alternately positioned in different locations which are different in distance from the substrate; and a shield plate interposed between the conductor layers to electromagnetically shield the conductor layers from each other.

According to the invention, there is further provided a multi-probe unit used for electrical inspection and having a plurality of probes for contact with a plurality of conductor patterns to be inspected which are aligned side by side, in which every two adjacent ones of the probes for contact with odd-numbered one and even-numbered one of the conductor patterns are positioned in upper and lower levels distant in the thickness direction, and a shield plate of a conductive material having an electrically shielding function is interposed between the upper and lower probes.

According to the invention, there is further provided a measuring apparatus having an external device having at least a built-in measuring device, and a multi-probe unit which is electrically connected to the external device, characterized in: the multi-probe unit having conducting wires which have first end portions forming probes whose extreme ends contact with a number of densely arranged conductor patterns and second ends electrically connected to a measuring apparatus, and including a substrate which can be held from outside; a number of covered conducting wires each made of a central conductor whose intermediate portion except opposite end portions thereof is covered by an insulating cover, each central conductor having a first end portion which is bent to form the probe; a conductor fixing member for holding extreme ends of the probes of the covered conducting wires in alignment at substantially the same intervals au those of the conductor patterns, then radially spreading intermediate portions of the covered conducting wires relative to the first end portions thereof, and fixing the intermediate portions of the covered conducting wires such that the intermediate portions be alternately positioned in different locations which are different in distance from the substrate; and a shield plate interposed between the conductor layers to electromagnetically shield the conductor layers from each other.

According to the invention, there is further provided a measuring apparatus comprising: an external device having at least a built-in measuring device; and a multi-probe unit which is electrically connected to the external device, and has a plurality of probes for contact with a plurality of conductor patterns to be inspected which are aligned side by side, in which every two adjacent ones of the probes for contact with odd-numbered one and even-numbered one of the conductor patterns are positioned in upper and lower levels distant in the thickness direction, and a shield plate of a conductive material having an electrically shielding function is interposed between the upper and lower probes.

DESCRIPTION OF THE PREFERRED EMBODIMENTS

Figure 1:
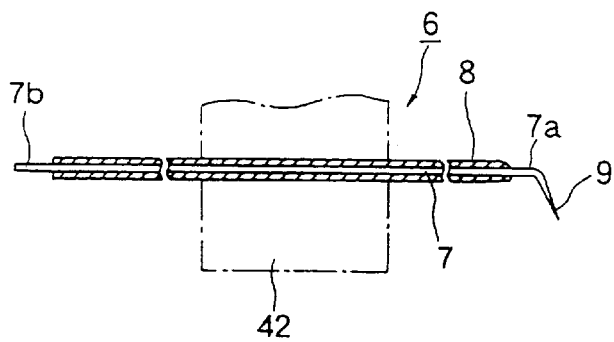
FIGS. 1A, B and 1C are vertical cross-sectional view and a bottom view illustrating configuration of a multi-probe unit according to an embodiment of the invention together with some major components.
Figure 1:
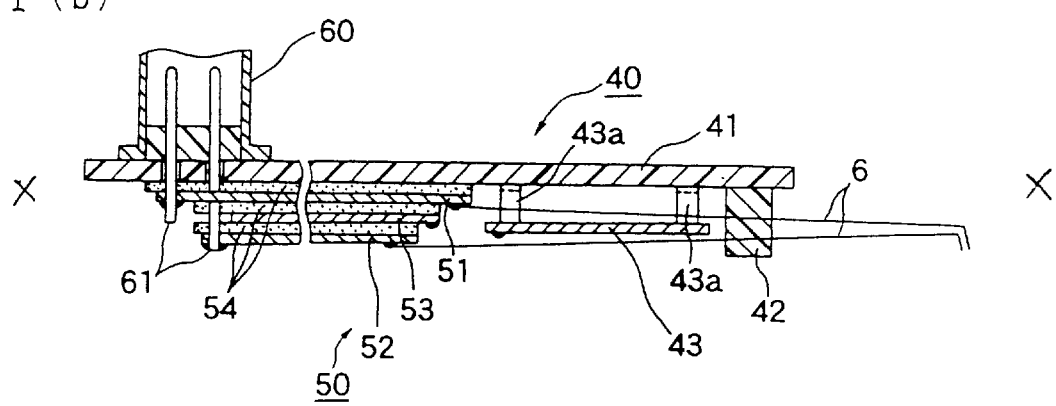
Figure 1:
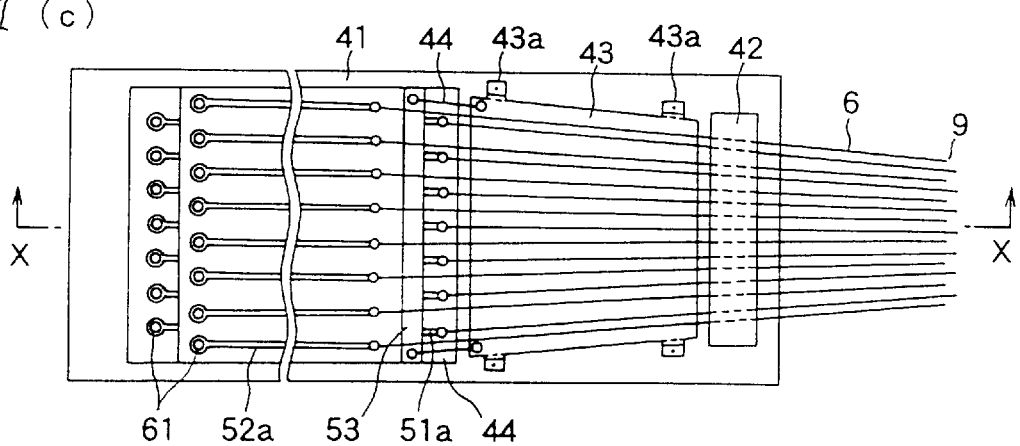
Figure 2A:
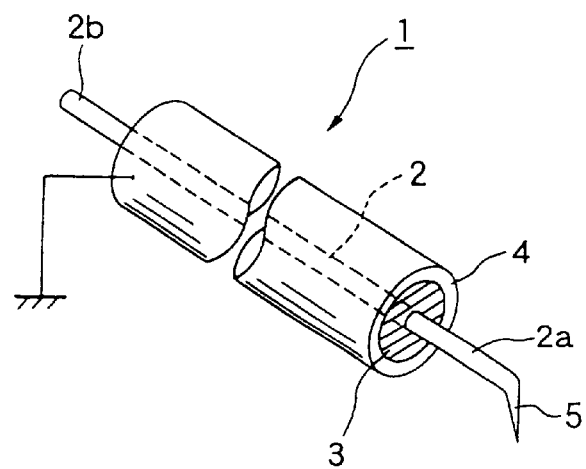
FIGS. 2A and 2B are perspective views illustrating configuration of a conventional multi-probe unit together with some major components.
Figure 2B:
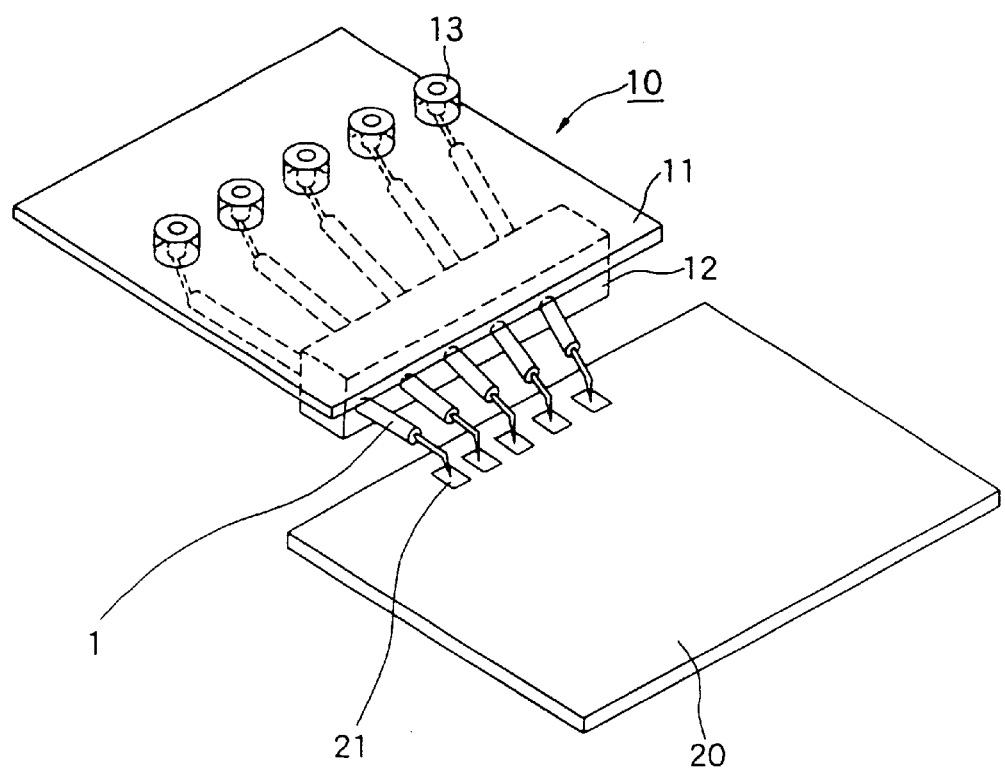

Some preferred embodiments of the invention are explained below in detail.

FIGS. 1A, 1B and 1C are vertical cross-sectional views and a bottom view illustrating configuration of a multi-probe unit according to an embodiment of the invention together with some major components. A covered conducting wire 6 is made by covering a central conductor 7 with an insulating cover 8, and a first end 7a and a second end 7b of the central conductor 7 are exposed by removing insulating cover 8. The first end 7a is bent like hook and sharpened to form a probe needle 9.

A multi-probe unit 40 is to be held in a holder, not shown, and includes grounded wires, among others A number of such covered conducting wires 6 are fixed by a conducting fixing member 42 secured onto the bottom surface of a front end of a printed circuit board 41. In this case, the covered conducting wires 6 are fixed such that their parts from the probe needles to intermediate portions radially spread out from positions of the probe needles 9 which are aligned at substantially equal intervals to densely arranged conductor patterns like electrodes, for example. Additionally, the covered conducting wires 6 are fixed by the conducting wire fixing member 42 such that their intermediate portions be alternately packed in two different levels from the bottom surface of the printed circuit board 41 by distributing every adjacent ones of the covered conducting wires 6 to upper and lower conductor layers in which conducting wires in the upper layer lie on between every two adjacent conducting wires in the lower layer. That is, probes in the upper layer and probes in the lower layer correspond to even-numbered ones and odd-numbered ones, respectively.

Between these layers of conducting wires in which intermediate portions are radially spread out, a shield plate 43 is inserted to electromagnetically shield the upper and lower conductor layers, and it is fixed to the printed circuit board 41 by hold portions 43a provided at opposite sides thereof. On the bottom surface of the rear end of the printed circuit board 41, a flexible printed circuit board 50 is mounted The flexible printed circuit board 50 includes a wiring layer 51, shield layer 53 and wiring layer 52 which are sequentially stacked via insulating layers 54. Among these components, the wiring layers 51 and 52 has wires 51 and wires 57a which are aligned in parallel, respectively, and the shield layer 53 is plate-like to electromagnetically shield the wiring layers 51 and 52 from others. Then, the second ends of the covered conducting wires 6 in the upper conductor layer are connected to wires at a first end of the wiring layer 51, and the second ends of the covered conducting wires 6 in the lower conductor layer are connected to the wires 52a at a first end of the wiring layer 52. Additionally, the shield plate 43 inserted between the upper and lower conductor layers is connected to the shield layer 53 of the flexible printed circuit board 50 by connectors 44.

For easier understanding, layers of the flexible printed circuit board 50 are illustrated as being considerably thick. Actually, however, the thickness of each layer in not larger than 0.1 mm, and even the whole thickness is around 0.3 mm.

On a rear end portion of the printed circuit board 41, a connector jack portion 60 is mounted The connector jack portion 60 has a number of terminals 61 aligned in two rows. Terminals 61 in one of the rows are connected to end portions of the wires on the wiring layer 51 whereas terminals 61 in the other line are connected to ends of wires on the wiring layer 52. Although not shown, the shield layer 53 is connected to a grounded terminal of the connector jack 60 as well.

Thus, by using the covered conducting wires 6 each made by covering the central conductor 7 having the diameter of 0.2 mm with the insulating cover 8 having the thickness around 0.02 through 0.05 mm, and by stacking them in a closely packed fashion including upper and lower conductor layers, here is obtained the multi-probe unit 40 which can bring the probe needles 9 into contact with narrow-pitch, densely-arranged electrodes which are about 100 electrodes aligned at intervals of 150 μm. Additionally, by separating or distributing the covered conducting wires 6 into the upper and lower conductor layers, inserting the shield plate 43 between them, and configuring the flexible printed circuit board 50 to include the shield layer 53 between the upper wiring layer 51 and the lower wiring layer 52 and connect the shield plate 43 and the shield layer 53 to the ground potential cross talk which was liable to occur between every adjacent covered conducting wives 6 can be reduced, and mixture of external noise can be reduced.

Although the embodiment has been explained as using as probes the probe needles of conductors with sharpened extreme ends closely packed in two stages, the same effect is obtained by using spring-contact probes having springs at their extreme ends, radially spreading intermediate portions of covered conducting wires relative to their ends at one terminal end, thus fixing them such that the intermediate portions of every adjacent covered conducting wires make a plurality of conductor layers, and inserting a shield plate between these conductor layers. Further, by providing a grounded shield layer between the wiring layers of the flexible printed circuit board for connecting the conductor layers to connectors, mixture of external noise and cross talk are more effectively reduced.

Although the embodiment has been explained as alternately, closely stacking the covered conducting wires in two different levels, the same effect is obtained also when they are closely packed and stacked in three different levels and inserting a shield plate between every adjacent conductor layers.

Furthermore, although the embodiment has been explained as making extreme ends of probes to contact electrodes, the object for contact is not limited to electrodes, but the embodiment is applicable to almost all conducing patterns including conductor wires.

Figure 3:
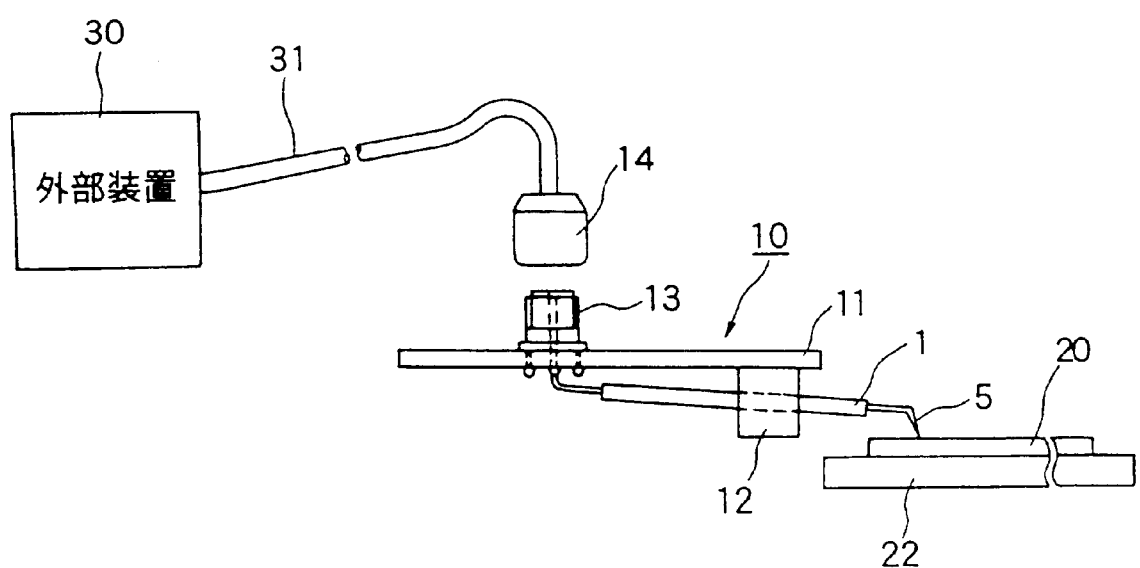
FIG. 3 is a measuring apparatus for electrically inspecting a liquid crystal display substrate by using a multi-probe unit according to the invention.

FIG. 3 shows a configuration of the whole apparatus for electrically inspecting a liquid crystal display substrate 20 by using the multi-probe unit 10 shown in FIG. 1. In FIG. 3, common reference numerals designate the same components, respectively. The liquid crystal display substrate 20 is fixed on the upper surface of a chuck 22, and the chuck is driven by a positioning device, not shown, to bring extreme ends of the probe needles 9 into contact with a number of electrodes 21 on the liquid crystal display substrate 20, respectively. Additionally, a connector plug portion 14 in connection with one end of a cable 31 extending from an external device 30 having built-in power source circuit and measuring device is coupled to a connector jack portion 60 mounted on the printed circuit board 41. In this status, electrical inspection of the liquid crystal display substrate 20 is executed.

As the skilled in the art will clearly understand, according to the invention, even by using covered conducting wires made of only conductors and insulators, mixture of external noise and cross talk can be reduced to a practically negligible extent, and a multi-probe unit and a measuring apparatus improved in electrical inspection performance can be obtained accordingly.

What is claimed is:

1. A multi-probe unit having conducting wires which have first end portions forming probes whose extreme ends contact with a number of densely arranged conductor patterns and second ends electrically connected to a measuring apparatus, comprising:

a substrate which can be held;

a number of covered conducting wires each made of a central conductor whose intermediate portion except opposite end portions thereof is covered by an insulating cover, each said central conductor having a first end portion which is bent to form said probes;

a conductor fixing member for holding extreme ends of said probes of said covered conducting wires in alignment at substantially the same intervals as those of said conductor patterns, then radially spreading intermediate portions of said covered conducting wires relative to said first end portions thereof, and fixing the intermediate portions of said covered conducting wires such that conducting layers are formed, the intermediate portions of said conducting layers being alternately positioned in different locations which are different in distance from said substrate; and a shield plate interposed between said conductor layers to electromagnetically shield said conductor layers form each other, said shield plate being arranged between said conductor fixing member and the first end portions of said covered conducting wires.

2. The multi-probe unit according to claim 1, wherein, when odd or even-numbered ones of said covered conducting wires form a first conductor layer while even or odd-numbered ones thereof form a second conductor layers, and said shield plate is positioned between said first conductor layer and said second conductor layer.

3. The multi-probe unit according to claim 2 wherein said first conductor layer and said second conductor layer lie in vertically different levels, and said shield plate is positioned between said first conductor layer and said second conductor layer which lie in vertically different levels.

4. The multi-probe unit according to claim 1 further comprising:

a connector mounted on said substrate; and a flexible substrate supported by said substrate and having a plurality of wiring layers corresponding to said conductor layers and a shield layer interposed between every adjacent ones of said wiring layers, each said wiring layer having one wiring end connected to conducting lines in corresponding one of said conduction layers and the other wiring end connected to terminals of said connector, and each said shield layer being connected to corresponding one of said shield plate interposed between said conductor layers.

5. The multi-probe unit according to claim 1 wherein said shield plate is connected to a ground potential.

6. A multi-probe unit used for electrical inspection and having a plurality of probes for contact with a plurality of conductor patterns to be inspected which are aligned side by side, in which every two adjacent ones of said probes for contact with odd-numbered one and even-numbered one of said conductor patterns are positioned in upper and lower levels distant in the thickness direction, and a shield plate of a conductive material having an electrically shielding function is interposed between the upper and lower probes.

7. A measuring apparatus having an external device having at least a built-in measuring device, and a multi-probe unit which is electrically connected to said external device, characterized in:

said multi-probe unit having conducting wires which have first end portions forming probes whose extreme ends contact with a number of densely arranged conductor patterns and second ends electrically connected to a measuring apparatus, and including:

a substrate which can be held;

a number of covered conducting wires each made of a central conductor whose intermediate portion except opposite end portions thereof is covered by an insulating cover, each said central conductor having a first end portion which is bent to form said probe;

a conductor fixing member for holding extreme ends of said probes of said covered conducting wires in alignment at substantially the same intervals as those of said conductor patterns, then radially spreading intermediate portions of said covered conducting wires relative to said first end portions thereof, and fixing the intermediate portions of said covered conducting wires such that conductor layers are formed, the intermediate portions of said conductor layers being alternately positioned in different locations which are different in distance from said substrate; and a shield plate interposed between said conductor layers to electromagnetically shield said conductor layers from each other, said shield plate being arranged between said conductor fixing member and the other ends of said covered conducting wires.

8. The measuring apparatus according to claim 7 wherein, in said multi-probe unit, odd or even-numbered ones of said covered conducting wires form a first conductor layer while even or odd-numbered ones thereof form a second conductor layers, and said shield plate is positioned between said first conductor layer and said second conductor layer.

9. A measuring apparatus comprising:

an external device having at least a built-in measuring device; and a multi-probe unit which is electrically connected to said external device, and has a plurality of probes for contact with a plurality of conductor patterns to be inspected which are aligned side by side, in which every two adjacent ones of said probes for contact with odd-numbered one and even-numbered one of said conductor patterns are positioned in upper and lower levels distant in the thickness direction, and a shield plate of a conductive material having an electrically shielding function is interposed between the upper and lower probes.

* * * * *

UNITED STATES PATENT AND TRADEMARK OFFICE
CERTIFICATE OF CORRECTION

PATENT NO.    : 6,420,889 B1
DATED         : July 16, 2002
INVENTOR(S)   : Terada, Shigeki It is certified that error appears in the above-identified patent and that said Letters Patent is hereby corrected as shown below:

<u>Title page,</u>
Item [73], Assignee, please change "Kanagawa-Ken (JP)" to -- Kawasaki-shi (JP) --.
Item [22], Filed, please change "Jul. 24, 2000" to -- March 17, 2000 --.
Item [57], ABSTRACT, please amend the ABSTRACT to read as follows:

-- For the purpose of reducing noise entering from outside and cross talk to a practically negligible extent even when using covered conducting wires made of only conducting wires and insulators, a multi-probe unit has a plurality of probes for contact with a plurality of conductor patterns to be inspected which are aligned side by side, in which every two adjacent ones of the probes for contact with odd-numbered one and even-numbered one of the conductor patterns are positioned in upper and lower levels distant in the thickness direction, and a shield plate of a conductive material having an electrically shielding function is interposed between upper and lower probes. --

Signed and Sealed this

Fifteenth Day of April, 2003

JAMES E. ROGAN
*Director of the United States Patent and Trademark Office*